United States Patent
Kim et al.

(10) Patent No.: US 10,381,312 B2
(45) Date of Patent: Aug. 13, 2019

(54) SEMICONDUCTOR PACKAGE AND METHOD OF MANUFACTURING THE SAME

(71) Applicant: NEPES CO., LTD., Chungcheongbuk-do (KR)

(72) Inventors: Il-Hwan Kim, Chungcheongbuk-do (KR); Jun-Kyu Lee, Chungcheongbuk-do (KR); Min-A Yoon, Chungcheongbuk-do (KR); Dong-Hoon Oh, Seoul (KR); Tae-Won Kim, Chungcheongbuk-do (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 15/593,140

(22) Filed: May 11, 2017

(65) Prior Publication Data

US 2017/0330839 A1 Nov. 16, 2017

(30) Foreign Application Priority Data

May 13, 2016 (KR) ........................ 10-2016-0058825

(51) Int. Cl.
*H01L 23/552* (2006.01)
*H01L 21/3205* (2006.01)
(Continued)

(52) U.S. Cl.
CPC ...... *H01L 23/552* (2013.01); *H01L 21/32051* (2013.01); *H01L 21/56* (2013.01);
(Continued)

(58) Field of Classification Search
CPC ....... H01L 23/552; H01L 21/56; H01L 21/78; H01L 23/04; H01L 23/06;
(Continued)

(56) References Cited

U.S. PATENT DOCUMENTS 6,326,701 B1 12/2001 Shinogi et al.
2003/0218257 A1* 11/2003 Ishio .................. H01L 23/3114
257/781

(Continued)

FOREIGN PATENT DOCUMENTS

CN 102074551 5/2011
CN 103311225 9/2013

(Continued)

OTHER PUBLICATIONS

Office Action dated Feb. 28, 2018 for Japanese Patent Application No. 2017-095770 and its English machine translation by Global Dossier.

(Continued)

*Primary Examiner* — Thanh T Nguyen
(74) *Attorney, Agent, or Firm* — Ladas & Parry, LLP

(57) ABSTRACT

Disclosed herein are a semiconductor package and a method of manufacturing the same. The semiconductor package according to embodiments of the present disclosure includes a wiring including a plurality of layers including an insulating layer and a wiring layer, a semiconductor chip mounted on the wiring and electrically connected to the wiring layer through a bonding pad, a cover member configured to cover side surfaces of the semiconductor chip and the wiring and be in contact with at least one wiring layer, and an encapsulant configured to seal the cover member. Accordingly, the cover member covers the semiconductor chip and is in contact with the wiring formed under the semiconductor chip, thereby reducing electromagnetic interference, minimizing noise between operations of the semiconductor package, and improving a signal speed.

5 Claims, 5 Drawing Sheets

(51) Int. Cl.
*H01L 21/56* (2006.01)
*H01L 21/78* (2006.01)
*H01L 23/04* (2006.01)
*H01L 23/06* (2006.01)
*H01L 23/31* (2006.01)
*H01L 23/00* (2006.01)

(52) U.S. Cl.
CPC ............ *H01L 21/561* (2013.01); *H01L 21/78* (2013.01); *H01L 23/04* (2013.01); *H01L 23/06* (2013.01); *H01L 23/3114* (2013.01); *H01L 23/3135* (2013.01); *H01L 24/05* (2013.01); *H01L 24/11* (2013.01); *H01L 24/13* (2013.01); *H01L 21/568* (2013.01); *H01L 2224/0231* (2013.01); *H01L 2224/0239* (2013.01); *H01L 2224/02373* (2013.01); *H01L 2224/0401* (2013.01); *H01L 2224/11825* (2013.01); *H01L 2224/13023* (2013.01); *H01L 2224/13024* (2013.01); *H01L 2224/13147* (2013.01); *H01L 2224/13616* (2013.01); *H01L 2224/13639* (2013.01); *H01L 2224/13644* (2013.01); *H01L 2224/13655* (2013.01); *H01L 2924/01013* (2013.01); *H01L 2924/01022* (2013.01); *H01L 2924/01029* (2013.01); *H01L 2924/01047* (2013.01); *H01L 2924/01079* (2013.01); *H01L 2924/3025* (2013.01)

(58) Field of Classification Search
CPC ... H01L 21/32051; H01L 24/05; H01L 24/11; H01L 24/13; H01L 23/3114; H01L 2224/13147; H01L 2224/13024; H01L 2224/13023; H01L 2224/11825; H01L 2224/0401; H01L 2224/0239; H01L 2224/0231; H01L 2224/13616; H01L 2224/13639; H01L 2224/13644; H01L 2224/13655; H01L 2924/01013; H01L 2924/01022; H01L 2924/01029; H01L 2924/01047; H01L 2924/3025; H01L 2924/01079
See application file for complete search history.

(56) References Cited

U.S. PATENT DOCUMENTS

| | | |
|---|---|---|
| 2005/0104165 A1 | 5/2005 | Ishio et al. |
| 2011/0115060 A1* | 5/2011 | Chiu .................... H01L 21/568 |
| | | 257/660 |
| 2011/0272800 A1* | 11/2011 | Chino .................... H01L 21/561 |
| | | 257/737 |
| 2013/0228904 A1* | 9/2013 | Brunnbauer .......... H01L 21/561 |
| | | 257/659 |
| 2013/0234337 A1* | 9/2013 | Hsu ....................... H01L 23/552 |
| | | 257/774 |
| 2015/0069587 A1 | 3/2015 | Kamphuis et al. |
| 2016/0093796 A1 | 3/2016 | Arai |
| 2017/0110413 A1* | 4/2017 | Chen .................... H01L 21/3205 |
| 2017/0330871 A1* | 11/2017 | Kuan .................... H01L 25/167 |

FOREIGN PATENT DOCUMENTS

| | | |
|---|---|---|
| CN | 104051431 | 9/2014 |
| JP | 2000-243754 | 9/2000 |
| JP | 2003-124392 | 4/2003 |
| JP | 2003-347441 | 12/2003 |
| JP | 2009-135421 | 6/2009 |
| JP | 2009-212271 | 9/2009 |
| JP | 2011-119369 | 6/2011 |
| JP | 2011-124413 | 6/2011 |
| JP | 2016-72493 | 5/2016 |
| KR | 10-0877551 | 1/2009 |
| KR | 10-2012-0036128 | 4/2012 |

OTHER PUBLICATIONS

Office Action dated Jul. 4, 2017 for Korean Patent Application No. 10-2016-0058825 and its English machine translation by Google Translate.

Office Action dated Sep. 5, 2017 for Taiwanese Patent Application No. 10620912270 and its English machine translation by Google Translate.

Office Action dated Aug. 28, 2018 for Japanese Patent Application No. 2017-095770 and its English machine translation by Global Dossier.

Office Action dated Feb. 20, 2019 for Taiwanese Patent Application No. 106115766 and its English machine translation provided by Applicant foreign council.

Office Action dated Dec. 29, 2018 for Chinese Patent Application No. 201710335616.8 and its English machine translation by Global Dossier.

Decision to Grant dated Jan. 18, 2019 for Japanese Patent Application No. 2017-095770 and its English machine translation by Global Dossier.

* cited by examiner

[FIG 1]
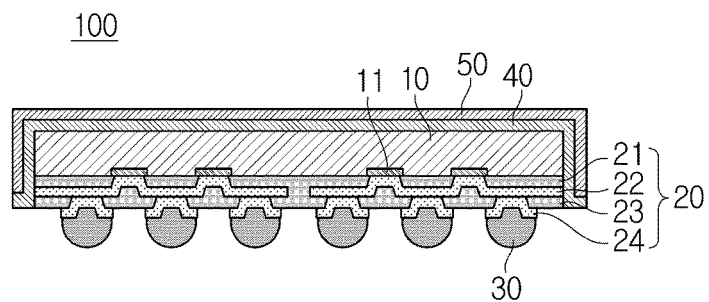
[FIG 2]
[FIG 3]
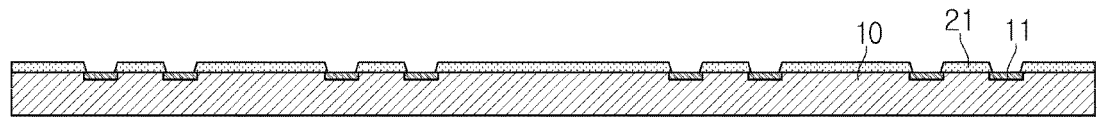

[FIG 4]
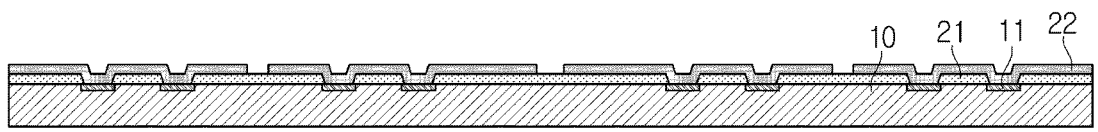
[FIG 5]
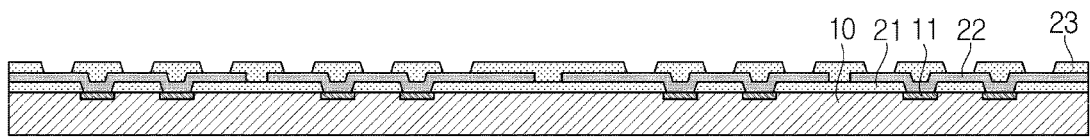
[FIG 6]
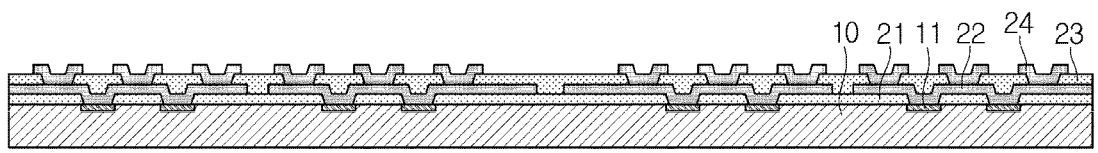

[FIG 7]
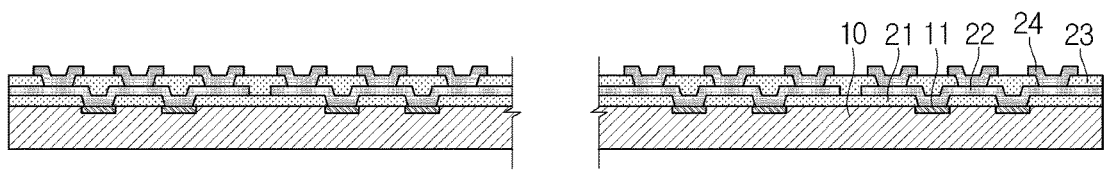
[FIG 8]
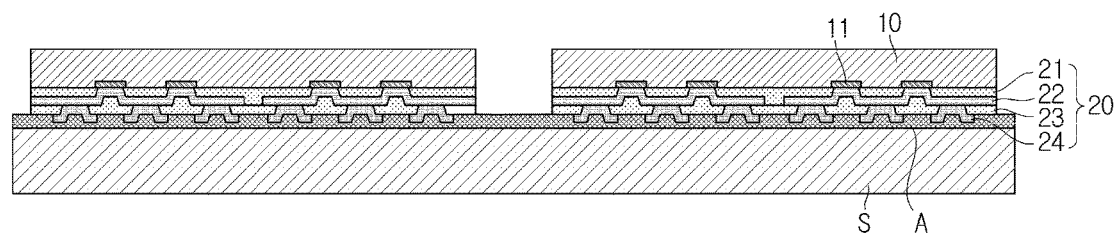
[FIG 9]
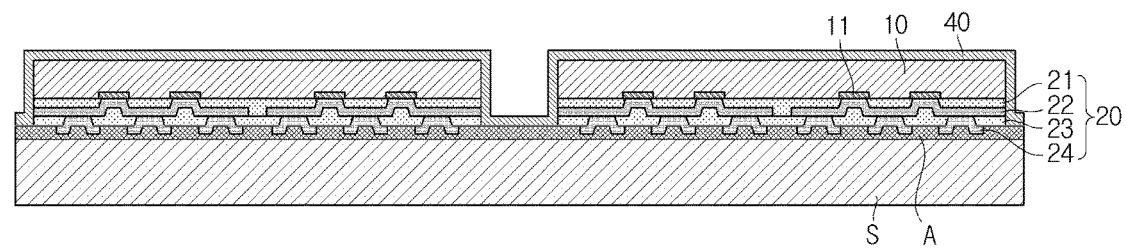

[FIG 10]
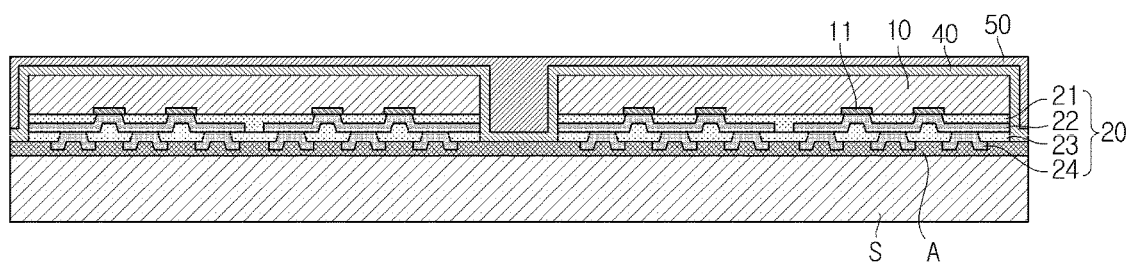
[FIG 11]
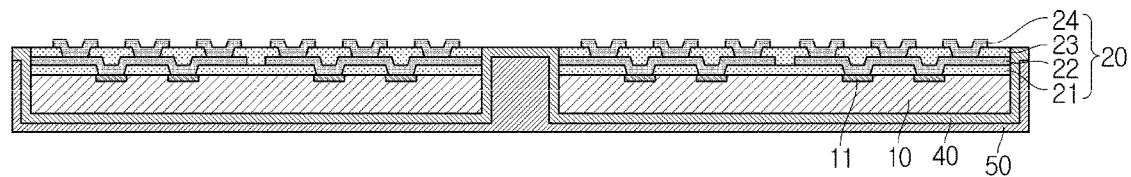
[FIG 12]
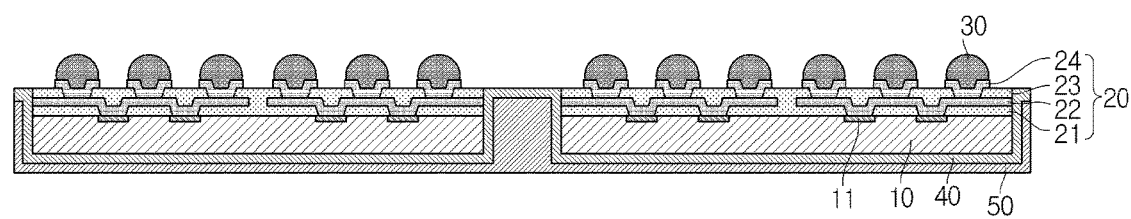

[FIG 13]
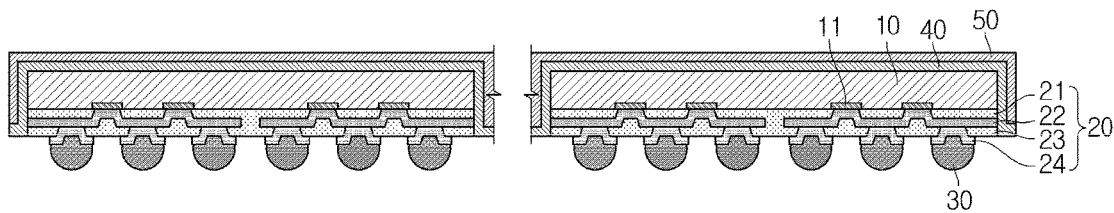
[FIG 14]
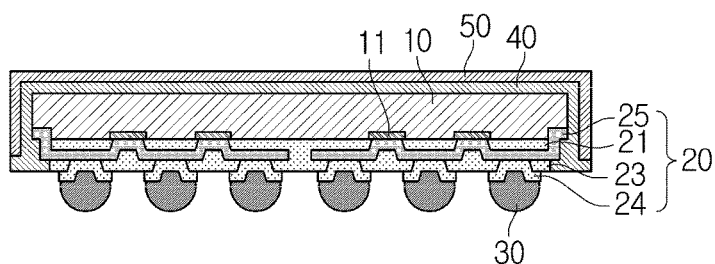
[FIG 15]
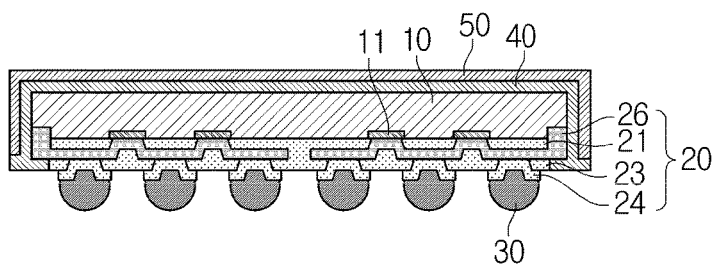

SEMICONDUCTOR PACKAGE AND METHOD OF MANUFACTURING THE SAME

CROSS-REFERENCE TO RELATED APPLICATION

This application claims the benefit of Korean Patent Application No. 2010-0128027, filed on Dec. 15, 2010 in the Korean Intellectual Property Office, the disclosure of which is incorporated herein by reference.

BACKGROUND

1. Field

Embodiments of the present disclosure relate to a semiconductor package and a method of manufacturing the same, and more particularly, a semiconductor package capable of reducing electromagnetic interference for an individual semiconductor package and a method of manufacturing the same.

2. Description of the Related Art

In recent semiconductor devices, as the size of a chip is decreased and the number of input/output terminals is increased due to miniaturization in process technology and diversification of functions, electrode pad pitch is gradually becoming finer and the convergence of various functions is accelerated, and thus a system-level packaging technology for integrating various components into one package is emerging. In addition, a system-level packaging technology is being changed to a three-dimensional stacking technology that can maintain a short range signal in order to minimize noise between operations and improve a signal speed.

Recently, as an operation speed of electronic components has been increased and various functions have been added, the reduction of electromagnetic interference (EMI) between components has become a major issue. Previously, an EMI shielding process was applied to printed circuit boards (PCBs) and connectors, but the performance of shielding the PCBs and connectors is lower than the performance of shielding EMI in individual packages, and the size of an entire system is increased. Recently, an EMI shielding technology is being changed to be directly applied to core chips. However, in the case of a conventional wafer level package (WLP), since a process is completed at a wafer level, it is difficult to additionally perform a shielding process, and even when the shielding process is performed, manufacturing costs are increased because the shielding process is performed on individual packages.

For example, Patent Document 1 discloses a method of forming a shielding film by sputtering, which includes a mounting process of mounting a plurality of chips on a substrate and electrically connecting the substrate and the chips with bonding wires or the like, a molding process of forming a molding portion around each chip using an epoxy or the like, a first cutting process of cutting the molding portion, which surrounds each chip while leaving the substrate, using a cutter, a sputtering process of forming a shielding film formed of a conductive material on upper and side surfaces of the molding portion by sputtering, a second cutting process of cutting and dividing the substrate into individual packages, and the like. However, in the method of forming a shielding film according to Patent Document 1, since the substrate is cut after sputtering is performed thereon, a shielding film is not formed on side surfaces of the substrate, and thus an additional process of forming a shielding film on the side surfaces of the substrate has to be performed.

DISCLOSURE

Patent Document 1: Korean Patent Registration No. 10-0877551 (published on Jan. 7, 2009)

SUMMARY

Therefore, it is an aspect of the present disclosure to provide a semiconductor package capable of reducing electromagnetic interference (EMI).

Further, it is another aspect of the present disclosure to provide a method of manufacturing such a semiconductor package.

Additional aspects of the disclosure will be set forth in part in the description which follows and, in part, will be obvious from the description, or may be learned by practice of the disclosure.

In accordance with one aspect of the present disclosure, a semiconductor package includes a wiring including a plurality of layers including an insulating layer and a wiring layer, a semiconductor chip mounted on the wiring and electrically connected to the wiring layer through a bonding pad, a cover member configured to cover side surfaces of the semiconductor chip and the wiring and be in contact with at least one wiring layer, and an encapsulant configured to seal the cover member.

The wiring may include a rewiring layer connected to the bonding pad of the semiconductor chip, a first insulating layer interposed between the semiconductor chip and the rewiring layer, a lower bump metal layer connected to the rewiring layer, and a second insulating layer interposed between the rewiring layer and the lower bump metal layer.

The semiconductor package may further include an external connector connected to the lower bump metal layer.

A side surface of the cover member may have a step.

The step of the cover member may protrude outward in a region in contact with at least one wiring layer.

The cover member may include a shielding material configured to shield EMI.

The cover member may include a conductive material including one or more selected from a group consisting of a metal and a ceramic, and the cover member may include one or more selected from a group consisting of copper (Cu), gold (Au), silver (Ag), and titanium (Ti).

One or both sides of the semiconductor chip may have a step formed by half-sawing.

The wiring layer may cover the step and be in contact with the cover member.

In accordance with another aspect of the present disclosure, a method of manufacturing a semiconductor package includes providing a semiconductor substrate including a bonding pad, forming a wiring on the semiconductor substrate, wherein the wiring includes a plurality of layers including an insulating layer and a wiring layer and is connected to the bonding pad, forming one or more semiconductor chips by dividing the semiconductor substrate into one or more regions, forming a cover member configured to cover side surfaces of the semiconductor chip and the wiring and be in contact with at least one wiring layer, and sealing the cover member using an encapsulant.

The forming of the wiring may include forming a first insulating layer on one surface of the semiconductor substrate on which the bonding pad is disposed, wherein the first insulating layer is configured to expose the bonding pad, forming a rewiring layer on the first insulating layer, wherein the rewiring layer is connected to the bonding pad, forming a second insulating layer on the rewiring layer, wherein the second insulating layer is configured to expose a part of the rewiring layer, and forming a lower bump metal layer on the second insulating layer, wherein the lower bump metal layer is connected to the rewiring layer.

The method may further include forming an external connector connected to the lower bump metal layer.

The method may further include, before the forming of the semiconductor chip, disposing the semiconductor chip on a carrier substrate so that the wiring of the semiconductor chip provided with the wiring faces the carrier substrate.

The cover member may include a shielding material configured to shield EMI.

The forming of the cover member may be performed by one or more processes selected from a group consisting of a film laminating process, a paste printing process, a spray coating process, a sputtering process, and a plating process using the shielding material.

The cover member may include a conductive material including one or more selected from a group consisting of a metal and a ceramic.

The cover member may include one or more selected from a group consisting of copper (Cu), gold (Au), silver (Ag), and titanium (Ti), and the forming of the wiring may further include half-sawing the semiconductor substrate.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 1 is a cross-sectional view for describing a semiconductor package according to one embodiment of the present disclosure;

FIGS. 2 to 13 are cross-sectional views for describing a method of manufacturing the semiconductor package of FIG. 1;

FIG. 14 is a cross-sectional view for describing a semiconductor package according to one embodiment of the present disclosure; and FIG. 15 is cross-sectional view for describing a semiconductor package according to one embodiment of the present disclosure.

DETAILED DESCRIPTION

Hereinafter, embodiments of the present disclosure will be described in detail with reference to the accompanying drawings. The following embodiments are presented to fully convey the idea of the present disclosure to those skilled in the art, and the present disclosure is not limited to the embodiments according to the present disclosure. The present disclosure may also be embodied in other embodiments. In order to clearly describe the present disclosure, parts not related to the description are omitted from the drawings, and the width, length, thickness, and the like of the components in the drawings are exaggerated for the sake of convenience. Like reference numerals designate like elements throughout the specification. In addition, the term "and/or" used below includes any one of the following listed items or all combinations of one or more of the following listed items.

FIG. 1 is a cross-sectional view for describing a semiconductor package according to one embodiment of the present disclosure.

A semiconductor package 100 according to one embodiment of the present disclosure will be described with reference to FIG. 1.

The semiconductor package 100 includes a semiconductor chip 10, a wiring 20, an external connector 30, a cover member 40, and an encapsulant 50.

The semiconductor chip 10 is mounted on the wiring 20 and electrically connected to the wiring 20 through bonding pads 11.

For example, the semiconductor chip 10 may be a die or integrated circuit (IC). Alternatively, the semiconductor chip 10 may be a memory chip or logic chip. For example, the memory chip may include a dynamic random access memory (DRAM), a static RAM (SRAM), a flash memory, a phase-change RAM (PRAM), a resistive RAM (ReRAM), a ferroelectric RAM (FeRAM), a magnetoresistive RAM (MRAM), etc. For example, the logic chip may be a controller configured to control memory chips.

Although not shown in the drawing, two or more semiconductor chips (not shown) may be provided in one package. The plurality of semiconductor chips may have the same type or different types. For example, there is a system-in-package (SiP) in which the plurality of semiconductor chips are provided in different types and electrically connected to each other so as to operate as one system. For example, one semiconductor chip may be an IC, and another semiconductor chip may be an active or passive component.

Although not shown in the drawing, the semiconductor chip 10 may have an active surface including an active region in which a circuit is formed and an inactive surface which is a surface opposite the active surface.

The bonding pad 11 may be formed on the active surface to exchange signals with an external device. In this case, the bonding pad 11 is integrally formed with the semiconductor chip 10, and the bonding pad 11 and the active surface may be provided to be coplanar.

Alternatively, a bump may be attached to one surface of the semiconductor chip 10 instead of a bonding pad integrally formed with a semiconductor chip. For example, the bump may be a Cu pillar bump or a solder bump.

The wiring 20 includes an insulating layer and a wiring layer. The wiring 20 may electrically connect the semiconductor chip 10 to the external connector 30 which will be described below.

For example, the wiring 20 may include a first insulating layer 21, a rewiring layer 22, a second insulating layer 23, and a lower bump metal layer 24.

For example, the first insulating layer 21 may be disposed between the semiconductor chip 10 and the rewiring layer 22. The rewiring layer 22 may be connected to the bonding pad 11 of the semiconductor chip 10. The second insulating layer 23 may be disposed between the rewiring layer 22 and the lower bump metal layer 24. The lower bump metal layer 24 may be connected to the rewiring layer 22.

The wiring 20 may be formed by a process of rearranging metal wires. For example, metal wires having fine patterns may be formed on one surface, i.e., an active surface, of a semiconductor wafer on which the bonding pads 11 are formed, using a photoresist process and a plating process.

The wiring 20 may include the insulating layers 21 and 23, the rewiring layer 22, and the lower bump metal layer 24.

The rewiring layer 22 and the lower bump metal layer 24 may include a conductive material and, for example, may include a metal such as copper (Cu), aluminum Al, or an alloy thereof.

The first insulating layer 21 and the second insulating layer 23 may include an organic or inorganic insulating material. For example, the first insulating layer 21 and the second insulating layer 23 may include an organic insulating material, such as an epoxy resin or the like, or may include an inorganic insulating material such as silicon oxide (SiOx), silicon nitride (SiNx), etc.

Further, the rewiring layer 22 may be connected to the bonding pad 11 of the semiconductor chip 10, and the lower bump metal layer 24 may be connected to the rewiring layer 22 and the external connector 30. In addition, the rewiring layer 22 and the lower bump metal layer 24 may be respectively formed on the first insulating layer 21 and the second insulating layer 23 by a metal patterning method.

Further, the first insulating layer 21 and the second insulating layer 23 may be formed by dielectric coating.

The wiring 20 may form a circuit by rewiring the semiconductor chip 10.

For example, the external connector 30 may be connected to the lower bump metal layer 24. Accordingly, the external connector 30 is electrically connected to the semiconductor chip 10 so that electrical signals may be input or output therethrough.

The external connector 30 may be electrically connected to the wiring 20 and may be used as an intermediary for connecting the semiconductor package 100 to an external circuit or another semiconductor package (not shown). For example, one side of the external connector 30 may be connected to the lower bump metal layer 24, and the other side thereof may be exposed to the outside.

Although the drawing shows a solder ball as an example of the external connector 30, the external connector 30 may be a solder bump or the like. Alternatively, the external connector 30 may be made of another material other than solder.

Further, a surface of the external connector 30 may be prevented from being oxidized by performing a surface treatment such as organic material coating, metal plating, or the like. For example, the organic material coating may be organic solder preservation (OSP) coating, and the metal plating may be a treatment such as gold (Au), nickel (Ni), lead (Pb), or silver (Ag) plating.

The cover member 40 covers side surfaces of the semiconductor chip 10 and the wiring 20 and may be in contact with the rewiring layer 22.

For example, the side surface of the cover member 40 may have a step.

At this time, the step of the cover member 40 may protrude outward in a region in contact with the rewiring layer 22.

When the cover member 40 is formed on individual packages instead of a wafer, the step of the cover member 40 is not formed.

When a cover member is formed on individual packages by a process such as a sputtering process, a spray coating process, etc., it is difficult for such processes to form a uniform cover member on side surfaces of a package. That is, when the step coverage of the cover member is degraded, a short circuit of a wiring layer may occur and the purpose of shielding electromagnetic interference (EMI) may not be achieved. In addition, when a thickness of the cover member is increased to improve the step coverage, a total thickness of a semiconductor package is increased.

The cover member 40 may be provided to protect the semiconductor chip 10 from external environments. For example, the cover member 40 may be provided to cover the inactive surface and side surfaces of the semiconductor chip 10. Particularly, the cover member 40 may cover side surfaces of the first insulating layer 21 and the second insulating layer 23 so that the rewiring layer 22 is not exposed to the outside.

Since the cover member 40 is provided as a film thinner than the semiconductor chip 10, the slim semiconductor package 100 may be made.

The cover member 40 may be a shielding material capable of shielding EMI. For example, the cover member 40 may include a conductive material including one or more selected from a group consisting of a metal and a ceramic, and specifically, the cover member 40 may include one or more selected from a group consisting of copper (Cu), gold (Au), silver (Ag), and titanium (Ti).

Further, although the drawing shows that the semiconductor chip 10 is sealed by the cover member 40 provided as one layer, the cover member 40 may be formed by sequentially applying two or more members having different functions. For example, a coating process may be performed to surround the semiconductor chip 10 with a material having an EMI shielding function, and then, another coating process may be performed thereon with a material having high strength.

The encapsulant 50 may seal the cover member 40.

The encapsulant 50 may be molded to integrate the semiconductor chip 10 with the wiring 20. The encapsulant 50 may include an insulating material and, for example, may include an epoxy mold compound (EMC) or a general encapsulant.

The encapsulant 50 in a liquefied state may be injected and cured at high temperature. In this case, for example, a process of simultaneously heating and pressing the encapsulant 50 may be performed, and at this time, a vacuum process may be additionally performed to remove a gas or the like inside the encapsulant 50. While the encapsulant 50 is cured, the semiconductor chip 10 and the wiring 20 are integrated to form one structure.

The encapsulant 50 may be provided to surround an entire surface of the cover member 40. In addition, after sealing with the encapsulant 50, a cross section of the semiconductor package 100 may be provided to have a rectangular shape.

When the cover member 40 and the encapsulant 50 are simultaneously provided, the cover member 40 and the encapsulant 50 may serve different functions. For example, the cover member 40 may serve to shield EMI, and the encapsulant 50 may serve to mechanically protect the semiconductor package 100. Furthermore, the encapsulant 50 may prevent adjacent semiconductor packages from being electrical connected.

When a desired mechanical strength of the semiconductor chip 10 is sufficiently satisfied with only the cover member 40, the encapsulant 50 may be omitted.

FIGS. 2 to 13 are cross-sectional views for describing a method of manufacturing the semiconductor package of FIG. 1.

A method of manufacturing the semiconductor package 100 according to one embodiment of the present disclosure will be described with reference to FIGS. 1 to 13. Content overlapping content in the description of the semiconductor chip of FIG. 1 will be briefly described or be omitted.

FIG. 2 shows a process of providing a semiconductor substrate 10, FIG. 3 shows a process of forming the first insulating layer 21, and FIG. 4 shows a process of forming the rewiring layer 22.

Referring to FIG. 2, the semiconductor substrate 10 on which the bonding pads 11 are formed is provided. The semiconductor substrate 10 may be provided to form a die or IC, a memory chip, or a logic chip. The semiconductor substrate 10 may be provided as a wafer.

Referring to FIG. 3, the first insulating layer 21 is formed on an active surface of the semiconductor substrate 10, i.e., one surface of the semiconductor substrate 10 on which the bonding pads 11 are formed. The first insulating layer 21 may have holes which expose the bonding pads 11, wherein the holes are made by an etching process after the one surface of the semiconductor substrate 10 is coated with an insulating material.

Referring to FIG. 4, the rewiring layer 22 is formed on the first insulating layer 21. The rewiring layer 22 is connected to the bonding pads 11. The rewiring layer 22 may be formed to have a metal pattern by coating the first insulating layer 21 with a metal material and performing a photoresist process or the like thereon.

For example, coating may be performed on the rewiring layer 22 using a general plating process or a via-fill plating process.

FIG. 5 shows a process of forming the second insulating layer 23, FIG. 6 shows a process of forming the lower bump metal layer 24, and FIG. 7 shows a process of cutting and dividing the semiconductor substrate 10 into individual semiconductor chips 10.

Referring to FIG. 5, the second insulating layer 23 is formed on the rewiring layer 22. The second insulating layer 23 may have holes which expose a part of the rewiring layer 22, wherein the holes are made by an etching process after the rewiring layer 22 is coated with an insulating material.

Referring to FIG. 6, the lower bump metal layer 24 is formed on the second insulating layer 23. The lower bump metal layer 24 is connected to the rewiring layer 22. The lower bump metal layer 24 may be formed to have a metal pattern by coating the second insulating layer 23 with a metal material and performing a photoresist process or the like thereon.

Referring to FIG. 7, the semiconductor substrate 10, on which the wiring 20 including the wiring layer and the insulating layer is formed, is cut and divided into individual semiconductor chips 10.

That is, the semiconductor substrate 10 is divided into one or more regions in which one or more semiconductor chips 10 are formed.

FIG. 8 shows a process of disposing individual semiconductor chips 10 on a carrier substrate, FIG. 9 shows a process of forming a cover member, and FIG. 10 shows a process of sealing with an encapsulant.

Referring to FIG. 8, the semiconductor chip 10 is disposed on a carrier substrate S so that the wiring 20 of the semiconductor chip 10, on which the wiring 20 is formed, faces the carrier substrate S. The carrier substrate S may be provided as a wafer or panel.

The carrier substrate S may be formed of a rigid type material, and for example, may be formed using a mold, a polyimide tape, etc.

In addition, an adhesive layer A may be additionally disposed on one surface of the carrier substrate S to attach the semiconductor chip 10 to the one surface. The adhesive layer A may be a double-sided adhesive film, wherein one surface of the adhesive layer A is attached and fixed to the carrier substrate S, and the other surface thereof is attached to the semiconductor chip 10.

Referring to FIG. 9, the cover member 40 configured to cover the semiconductor chip 10 and the wiring 20 is formed. The cover member 40 covers upper and side surfaces of the semiconductor chip 10 and side surfaces of the wiring 20. The cover member 40 may be in contact with the wiring 20, and more specifically, may be in contact with the rewiring layer 22 of the wiring 20.

The cover member 40 may be provided to protect the semiconductor chip 10 from external environments. For example, the cover member 40 may be provided to cover an inactive surface and side surfaces of the semiconductor chip 10. Particularly, the cover member 40 may cover all side surfaces of the first insulating layer 21 and the second insulating layer 23 so that the rewiring layer 22 is not exposed to the outside.

The cover member 40 may include a shielding material capable of shielding EMI. For example, the cover member 40 may be formed by one or more processes selected from a group consisting of a film laminating process, a paste printing process, a spray coating process, a sputtering process, and a plating process using the shielding material, but the method of forming the cover member 40 is not limited thereto.

For example, the cover member 40 may include a conductive material including one or more selected from a group consisting of a metal and a ceramic, and specifically, the cover member 40 may include one or more selected from a group consisting of copper (Cu), gold (Au), silver (Ag), and titanium (Ti).

Referring to FIG. 10, the cover member 40 is sealed using the encapsulant 50.

The encapsulant 50 may be molded to integrate the semiconductor chip 10 with the wiring 20. The encapsulant 50 may include an insulating material and, for example, may include an EMC or a general encapsulant.

The encapsulant 50 in a liquefied state may be injected and cured at high temperature. In this case, for example, a process of simultaneously heating and pressing the encapsulant 50 may be performed, and at this time, a vacuum process may be additionally performed to remove a gas or the like inside the encapsulant 50. While the encapsulant 50 is cured, the semiconductor chip 10 and the wiring 20 are integrated to form one structure.

When the cover member 40 and the encapsulant 50 are simultaneously provided, the cover member 40 and the encapsulant 50 may serve different functions. For example, the cover member 40 may serve to shield EMI, and the encapsulant 50 may serve to mechanically protect the semiconductor package 100.

When a desired mechanical strength of the semiconductor chip 10 is sufficiently satisfied with only the cover member 40, the encapsulant 50 may be omitted.

FIG. 11 shows a process of removing the carrier substrate S, FIG. 12 show a process of forming external connectors 30, and FIG. 13 shows a process of cutting and separating individual semiconductor chips 10.

Referring to FIG. 11, individual semiconductor chips 10 attached to the carrier substrate S are separated from the carrier substrate S. At this time, the adhesive layer A attached to the wiring 20 of the semiconductor chip 10 may also be removed when the carrier substrate S is removed.

Referring to FIG. 12, the external connector 30 is formed on the lower bump metal layer 24 of the wiring 20 of the semiconductor chip 10. For example, the external connector 30 may be connected to the lower bump metal layer 24.

The external connector 30 may be electrically connected to the wiring 20 and may be used as an intermediary for connecting the semiconductor package 100 to an external circuit or another semiconductor package (not shown). For example, one side of the external connector 30 may be connected to the lower bump metal layer 24, and the other side thereof may be exposed to the outside.

Although the drawing shows a solder ball as an example of the external connector 30, the external connector 30 may be a solder bump or the like. Alternatively, the external connector 30 may be made of another material other than solder.

Further, a surface of the external connector 30 by may be prevented from being oxidized by performing a surface treatment such as organic material coating, metal plating, or the like. For example, the organic material coating may be OSP coating, and the metal plating plating may be a treatment such as gold (Au), nickel (Ni), lead (Pb), or silver (Ag) plating.

Referring to FIG. 13, individual semiconductor chips 10 are cut and separated, and final products of the semiconductor chip 10 are manufactured.

FIG. 14 is a cross-sectional view for describing a semiconductor package 200 according to one embodiment of the present disclosure.

Referring to FIG. 14, the semiconductor package 200 includes a wiring 20 including insulating layers 21 and 23 and wiring layers 24 and 25, a semiconductor chip 10 mounted on the wiring 20 and electrically connected to the wiring layers 24 and 25 through bonding pads 11, and a cover member 40 configured to cover side surfaces of the semiconductor chip 10 and the wiring 20 and be in contact with the wiring layers 24 and 25.

The wiring 20 includes a rewiring layer 25 connected to the bonding pad 11 of the semiconductor chip 10 and an first insulating layer 21 disposed between the semiconductor chip 10 and the rewiring layer 25.

One or both sides of each of the semiconductor chip 10 and the first insulating layer 21 have steps formed by half-sawing, the rewiring layer 25 covers the steps, and the steps are in contact with the cover member 40. For example, the rewiring layer 25 may be formed by a general plating process and then etched to form a metal pattern.

As described above, since the steps are formed on one or both sides of each of the semiconductor chip 10 and the first insulating layer 21 and the steps are formed to be covered by the rewiring layer 25, areas of side surfaces of the rewiring layer 25 can be increased, and a contact area between the rewiring layer 25 and the cover member 40 which will be formed later can be increased. Accordingly, there is an advantage that EMI can be more efficiently shielded.

FIG. 15 is a cross-sectional view for describing a semiconductor package 300 according to one embodiment of the present disclosure.

Referring to FIG. 15, the semiconductor package 300 includes a wiring 20 including insulating layers 21 and 23 and wiring layers 24 and 26, a semiconductor chip 10 mounted on the wiring 20 and electrically connected to the wiring layers 24 and 26 through bonding pads 11, and a cover member 40 configured to cover side surfaces of the semiconductor chip 10 and the wiring 20 and be in contact with the wiring layer 24 and 26.

The wiring 20 includes a rewiring layer 26 connected to the bonding pad 11 of the semiconductor chip 10 and a first insulating layer 21 disposed between the semiconductor chip 10 and the rewiring layer 26.

One or both sides of each of the semiconductor chip 10 and the first insulating layer 21 have steps formed by half-sawing, the rewiring layer 26 covers the steps, and the steps are in contact with the cover member 40. For example, the rewiring layer 26 may be formed by a via-fill plating process and then etched to form a metal pattern.

As described above, since the steps are formed on one or both sides of each of the semiconductor chip 10 and the first insulating layer 21 and the steps are formed to be covered by the rewiring layer 26, areas of side surfaces of the rewiring layer 26 can be increased, and a contact area between the rewiring layer 26 and the cover member 40 which will be formed later can be increased. Accordingly, there is an advantage that EMI can be more efficiently shielded.

As is apparent from the above description, a cover member covers a semiconductor chip and is in contact with a wiring formed under the semiconductor chip, and thereby EMI can be reduced, noise between operations of a semiconductor package can be minimized, and a signal speed can be improved.

Further, since a cover member is formed at a wafer level instead of on individual semiconductor chips, a manufacturing process can be simplified and process costs can be reduced. In addition, a half-sawing process is additionally performed, thus a contact area between a wiring and the cover member is increased, and thereby EMI can be more easily reduced.

Further, since a cover member is formed on a semiconductor chip, the semiconductor chip is mechanically protected. In addition, an additional encapsulant can mechanically protect the semiconductor chip and can serve to dissipate heat.

Although a few embodiments of the present disclosure have been shown and described, it should be understood by those skilled in the art that changes may be made in these embodiments without departing from the principles and spirit of the disclosure, the scope of which is defined in the claims and their equivalents.

What is claimed is:

1. A semiconductor package comprising:
   a wiring including a plurality of layers including an insulating layer and a wiring layer;
   a semiconductor chip mounted on the wiring and electrically connected to the wiring layer through a bonding pad;
   a cover member configured to cover side surfaces of the semiconductor chip and the wiring and be in contact with at least one wiring layer; and
   an encapsulant configured to seal the cover member,
   wherein the wiring further includes a rewiring layer connected to the bonding pad of the semiconductor chip and a first insulating layer interposed between the semiconductor chip and the rewiring layer,
   wherein one or both sides of the semiconductor chip and the first insulating layer have a step formed by half-sawing, and
   wherein the rewiring layer covers the step and is in contact with the cover member.

2. The semiconductor package of claim 1, wherein the wiring includes:
   a lower bump metal layer connected to the rewiring layer;
   a second insulating layer interposed between the rewiring layer and the lower bump metal layer, and
   an external connector connected to the lower bump metal layer.

3. The semiconductor package of claim 1, wherein a side surface of the cover member has a step, wherein the step of the cover member protrudes outward in a region in contact with the wiring layer.

4. The semiconductor package of claim 1, wherein the cover member includes a shielding material configured to shield electromagnetic interference (EMI),
- the cover member includes one or more selected from a group consisting of a metal and a ceramic; and
- the cover member includes one or more selected from a group consisting of copper (Cu), gold (Au), silver (Ag), and titanium (Ti).

5. The semiconductor package of claim 1, wherein the wiring layer covers the step and is in contact with the cover member.

* * * * *